United States Patent [19]
Parris

[11] Patent Number: 5,430,680
[45] Date of Patent: Jul. 4, 1995

[54] DRAM HAVING SELF-TIMED BURST REFRESH MODE

[75] Inventor: Michael C. Parris, Colorado Springs, Colo.

[73] Assignees: United Memories, Inc., Colorado Springs, Colo.; Nippon Steel Semiconductor Corp., Chiba, Japan

[21] Appl. No.: 134,928

[22] Filed: Oct. 12, 1993

[51] Int. Cl.⁶ .................. G11C 11/401; G11C 11/406
[52] U.S. Cl. ...................................... 365/222; 365/236; 365/203
[58] Field of Search ......................... 365/222, 236, 203

[56] References Cited

U.S. PATENT DOCUMENTS

| | | | |
|---|---|---|---|
| 4,333,167 | 6/1982 | McElroy | 365/222 |
| 4,494,222 | 1/1985 | White et al. | 365/222 |
| 4,500,974 | 2/1985 | Nagami | 365/222 |
| 4,503,525 | 3/1985 | Malik et al. | 365/222 |
| 4,549,284 | 10/1985 | Ikuzaki | 365/222 |
| 4,691,303 | 9/1987 | Churchward et al. | 365/222 |
| 4,706,221 | 11/1987 | Satoh et al. | 365/222 |
| 4,984,209 | 1/1991 | Rajaram et al. | 365/222 |
| 5,305,274 | 4/1994 | Proebsting | 365/222 |

OTHER PUBLICATIONS

Konishi et al., "A 38 ns 4 Mb DRAM with a Battery Back-up (BBU) Mode", 1990 *IEEE International Solid–State Circuits Conference* pp. 230–231, 303 (Feb. 16, 1990).

*Primary Examiner*—Joseph A. Popek
*Assistant Examiner*—Andrew Q. Tran
*Attorney, Agent, or Firm*—Edward D. Manzo; David Lucente

[57] ABSTRACT

Burst refresh mode circuitry is provided for a memory having cells in rows and columns, sense amplifiers and Latch N/Latch P driver circuitry, a RAS buffer, refresh counters, address buffers, row decoders, precharge circuitry producing shorting clocks, and a refresh detector circuit coupled to the Latch P circuitry to provide a restore finished (RF) signal indicative that a refresh cycle is substantially completed. Burst refresh mode entry circuitry detects proper conditions for entering burst refresh mode. An auto-refresh burst refresh mode circuit causes the RAS buffer to generate a new internal RAS signal. Burst refresh mode logic has counters to count the number of rows that have been refreshed. The system self-times the refreshing by responding to the restore finished signal. A delay circuit interposes a short delay for the precharge before another row is automatically refreshed in the burst refresh mode. Battery back-up mode circuitry is partially disabled.

22 Claims, 9 Drawing Sheets

| VCC | VCC | TIN | c0 |
| VSS | VSS | CIN | c1 |
| VBB | VBB | TOUT | t2 |
| | BRMAND | | |

320

XA1

| VCC | VCC | TIN | t2 |
| VSS | VSS | CIN | c2 |
| VBB | VBB | TOUT | t3 |
| | BRMAND | | |

321

XA2

| VCC | VCC | TIN | t3 |
| VSS | VSS | CIN | c3 |
| VBB | VBB | TOUT | t4 |
| | BRMAND | | |

322

XA3

| VCC | VCC | TIN | t4 |
| VSS | VSS | CIN | c4 |
| VBB | VBB | TOUT | t5 |
| | BRMAND | | |

323

XA4

| VCC | VCC | TIN | t5 |
| VSS | VSS | CIN | c5 |
| VBB | VBB | TOUT | t6 |
| | BRMAND | | |

324

XA5

| VCC | VCC | TIN | t6 |
| VSS | VSS | CIN | c6 |
| VBB | VBB | TOUT | t7 |
| | BRMAND | | |

325

XA6

| VCC | VCC | TIN | t7 |
| VSS | VSS | CIN | c7 |
| VBB | VBB | TOUT | t8 |
| | BRMAND | | |

326

XA7

| VCC | VCC | TIN | t8 |
| VSS | VSS | CIN | c8 |
| VBB | VBB | TOUT | t9 |
| | BRMAND | | |

327

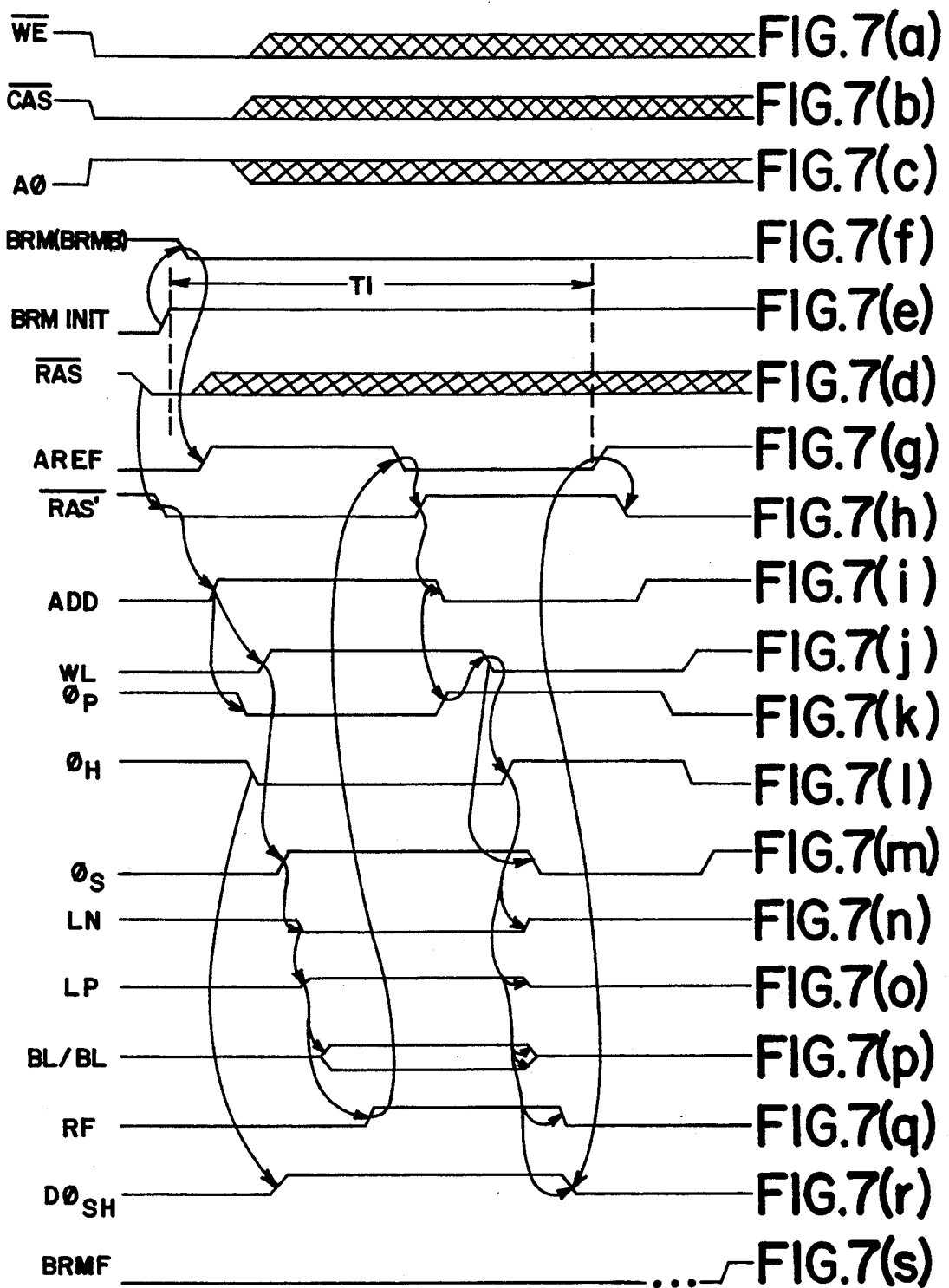

DRAM HAVING SELF-TIMED BURST REFRESH MODE

FIELD OF THE INVENTION

The present invention concerns method and apparatus for refreshing a memory device. It more particularly concerns a dynamic random access memory ("DRAM") burst refresh mode circuit and method where the DRAM is refreshed quickly to save overhead time.

BACKGROUND OF THE INVENTION

DRAMs include memory storage cells that store data on capacitors. Charge or lack of charge on these capacitors is used to represent logic "1" or "0" data states. The capacitors are susceptible to charge leaking off (or on) over periods of time, typically milliseconds, and must therefore be refreshed or restored to their representative data states periodically.

DRAMs are constructed of or organized into one or several memory cell arrays or subarrays consisting of rows and columns (which correspond to word lines and bit lines). When a row is selected during an active cycle, all of the cells along that row are sensed and restored. An active cycle is when the memory cells are accessed by word lines to read, write or refresh, for example. Then a precharge cycle is performed, which is not part of an active cycle, to ready the memory array to enter another active cycle.

To refresh the entire array, also done during an active cycle, generally only the rows need to be selected. All the capacitors of the memory cells along a row or portion of a row are refreshed when that row is addressed. (That is, all of the columns are operative during refresh.) Row selection can be done by cycling through all the row addresses with a row address strobe signal ("RAS"), or any standard read/write cycle. For example, column address strobe before row address strobe (CAS before RAS or "CBR") cycling provides the row address internally from refresh counters so that each row will be selected and refreshed.

The external signal $\overline{RAS}$, supplied by a system and provided externally of the memory package, is generally used to control many functions of a DRAM. One of its uses is analogous to a chip select signal as used by other types of chips. If the external signal $\overline{RAS}$ remains low for a long enough time, all of the active cycle clocks will operate in proper sequence, terminate and then wait for a user command, such as reading or writing new data by toggling $\overline{CAS}$, or returning to precharge by bringing $\overline{RAS}$ high.

As illustrated in FIGS. 1(a)–(k), active cycle events of conventional DRAMs are started with the falling edge of an external signal $\overline{RAS}$ (see FIG. 1(a)). For a refresh active cycle, the falling edge of the external signal $\overline{RAS}$ triggers an internal signal $\overline{RAS}'$ (FIGS. 1(a) and (b)). Internal signal $\overline{RAS}'$ is the main control signal of the internal functions of a memory part, and is illustrated as active low.

The falling edge of $\overline{RAS}'$ triggers an internal address signal ADD, which triggers a precharge clock signal $\phi_p$ and a shorting clock signal $\phi_{SH}$ (FIGS. 1(b), (c), (e) and (f)). Internal address signal ADD (shown as active high in FIG. 1(c)) allows the address, supplied externally or by internal counters, to be input to memory row decoders of the memory. Precharge clock signal $\phi_p$ is a representation of one or more precharge clocks used to trigger precharge functions of the memory device. As shown in FIG. 1(e), precharge clock signal $\phi_p$ is active high, that is, when $\phi_p$ is high, the memory circuitry is precharged. Shorting clock signal $\phi_{SH}$ is used to trigger the shorting of the bit lines during precharge. The bit lines are shorted together so that small amounts of charge from the memory cells can be sensed when a memory cell is selected. Shorting clock signal $\phi_{SH}$ is illustrated in FIG. 1(f) as being an active high clock. That is, when $\phi_{SH}$ is high, the bit lines are shorted.

Internal address signal ADD triggers a word line signal WL as shown in FIGS. 1(c) and (d). Essentially, word line signal WL is generated from the decoded address that internal address signal ADD allowed to pass to the row decoder. WL is one of many word lines or rows in a memory cell array (for example a typical 4 meg DRAM can be configured as 1024 rows by 4096 columns). Word line signal WL triggers a sense clock signal $\phi_s$ (FIGS. 1(d) and (g)). Sense clock signal $\phi_s$ represents one or more sense clock signals which are used to enable sense amplifiers of the memory to read corresponding bit lines.

As seen in FIGS. 1(g)–(i), sense clock signal $\phi_s$ triggers a latch signal LN and a latch signal LP, which have active states that are low and high, respectively. Latch signals LN and LP are sense amplifier driver signals that control the bit line sense amplifiers. When the sense amplifiers latch, each bit line connected thereto is driven either high or low, depending on the voltage of that bit line (or the differential in voltage between the two bit lines). Driving the LP and LN lines high or low serves to latch the logic value present on the bit lines as shown in FIG. 1(h)–(j) which will restore full levels back into the memory cells.

Typically, a restore finished signal RF is triggered when latch signal LP reaches a predetermined level. At this point the memory array is ready to enter a precharge cycle.

A precharge cycle generally vAll not start as long as the external signal $\overline{RAS}$ remains low. When the user or system causes the external signal $\overline{RAS}$ to go high, if the signal RF is high, then the precharge cycle begins. The precharge cycle will complete itself if the external signal $\overline{RAS}$ remains high long enough. The right side of FIGS. 1(a)–(k) shows a timing sequence for a precharge cycle for a conventional DRAM. External signal $\overline{RAS}$ triggers internal signal $\overline{RAS}'$ to become inactive. FIGS. 1(a), (b). $\overline{RAS}'$ triggers internal address signal ADD to become inactive and precharge clock signal $\phi_p$ to become active, as shown in FIGS. 1(b), (c) and (e). Precharge clock signal $\phi_p$ triggers word line signal WL to become inactive. See FIGS. 1(d) and (e).

FIGS. 1(d) and (f) show that word line signal WL triggers the shorting clock signal $\phi_{SH}$ to become active and sense clock signal $\phi_s$ inactive. Shorting clock signal $\phi_{SH}$ triggers the latch signals LN and LP to become inactive, and bit line and bit line bar signals BL/$\overline{BL}$ to a precharged state, as shown in FIGS. 1(f) and (h)–(j). The precharged state of bit line and bit line bar lines BL/$\overline{BL}$ is typically VCC/2 (where VCC is a power supply voltage).

FIGS. 1(a)–(k) show one cycle for refreshing and precharging one row address. It is important to note that external signal $\overline{RAS}$ is controlled by the user or system. After a row is accessed and restored, the user or system must change the state of external signal $\overline{RAS}$.

When external signal $\overline{RAS}$ changes, the precharge cycle is triggered. After the precharge cycle is completed, the memory waits until the user or system changes the state of external signal $\overline{RAS}$ to start yet another active cycle.

For conventional DRAMs, a time margin is added when specifying how quickly RAS can cycle or change. That is, minimum high and low times for the external signal $\overline{RAS}$ are specified for worst case operating conditions. At nominal or typical operating conditions, the time margin is wasted since internally the memory is operating faster. This time could be saved if the memory would, for at least refreshing purposes, automatically enter precharge when the active cycle is completed and then automatically enter the active cycle when precharge is completed. This would tend to minimize the cycle time for any given operating voltage and temperature.

Conventional DRAMs are driven or controlled by memory controller devices that are not part of the memory chip. These devices control the functions of the memory, such as read, write and refresh. Memory controller devices are typically quite complex to furnish the refresh operation for a DRAM. In the instance where the memory part uses CAS before RAS refreshing, the memory controller must supply column and row address strobes for each row that is to be refreshed. For a 4 megabit memory array, the memory controller would have to provide 1024 CAS before RAS cycles to refresh the whole memory.

In one prior patent to Malik and Celio, U.S. Pat. No. 4,503,525 entitled "COMMON CIRCUIT FOR DYNAMIC REFRESH AND SYSTEM CLOCK FUNCTION," a memory is controlled by a RAM controller. That patent seeks to use the dedicated system clock (which is external to both the RAM and the RAM controller) to control the refresh operation of the RAM, in addition to its basic use as a time-of-day counter.

It is known also to use counters located on the RAM chip itself for refreshing. For example, some DRAMs have a battery back-up mode where a refresh counter is used in the process of addressing rows for refreshing the DRAM, in a low power operation. Such systems are not directed to high speed operations but rather to conserving power. See, for example, Konishi et al. "A 38 ns 4 Mb DRAM with a Battery Back-up (BBU) Mode," *ISSCC* 90 pp. 230 et seq. ("The BBU mode is a kind of self refresh mode . . . As a result all memory cells are refreshed within 4096 cycles per 256 msec in the BBU mode.")

Therefore, it is a general object of the present invention to overcome the above-mentioned drawbacks and reduce complexity.

Another object of the present invention is to make semiconductor memories, especially DRAMS, more accessible to typical computer systems by reducing the time required for refresh operations.

An object of this invention is to create an operation, which I call a "burst refresh mode" (BRM) in order to refresh the data in a given DRAM in as little time as possible.

Whereas many users employ CAS before RAS refreshes to restore the data, another object of the invention is to allow the CAS before RAS cycles to be fewer in number or faster in cycle time, or both, so that the user has less of what the art refers to as "refresh overhead."

SUMMARY OF THE PRESENT INVENTION

This invention provides burst refresh mode ("BRM") circuitry to decrease the amount of time required to refresh a memory array. The invention is applicable to DRAMs, ferroelectric RAMs, and any other semiconductor RAM that can benefit from periodic refresh. A preferred embodiment of the present invention includes an internal address counter, another counter to count how many addresses have been accessed, and detection circuitry used to self-time the cycles of a memory array. The internal address counter is used to provide addresses to the address decoder faster than would be possible by providing the addresses from the external pins.

The present invention may also include a variable address circuit to increase the number of addresses accessed during an active cycle, thereby to reduce the number of addresses to be supplied. This further reduces the time needed to refresh the memory device.

A novel and important aspect of the operation of such burst refresh mode circuitry is its ability to reduce the amount of time for a memory array refresh without complicating the user or system interface with the memory part.

Another important aspect of such circuit is that it reduces the amount of circuitry required by the given (host) computer system memory controller, which will now need to provide fewer functions.

The invention also includes a method for operating a burst refresh mode circuit. A method of operating the circuit may comprise combining the steps of: (1) entering or initiating burst refresh mode; (2) self-timing the active cycle; (3) self-timing the activation of the precharge cycle and start of next active cycle; and (4) providing addresses from an internal counter.

In its preferred implementation, burst refresh mode circuitry is provided for a DRAM memory having volatile cells in rows and columns, sense amplifiers and Latch N/Latch P driver circuitry, a RAS buffer, refresh counters, address buffers, row decoders, precharge circuitry producing shorting clocks, and a refresh detector circuit coupled to the Latch P circuitry to provide a restore finished (RF) signal indicative that a refresh cycle is substantially completed. Burst refresh mode entry circuitry detects proper conditions for entering burst refresh mode. An auto-refresh burst refresh mode circuit causes the RAS buffer to generate a new internal RAS signal. Burst refresh mode logic has counters to count the number of rows that have been refreshed. The system self-times the refreshing by responding to the restore finished signal. A delay circuit interposes a short delay for the precharge before another row is automatically refresh in the burst refresh mode. Battery back-up mode circuitry is partially disabled.

BRIEF DESCRIPTION OF THE DRAWINGS

The invention, together with its objects and the advantages thereof, may better be understood by reference to the following detailed description taken in conjunction with the accompanying drawings in which:

FIGS. 6A and 6B together show a schematic diagram of the preferred embodiment of block 134 (burst refresh mode logic circuit) of FIG. 2; and FIGS. 7(a) to 7(s) are a set of timing diagrams for refresh and precharge cycles of a DRAM implementing the preferred embodiment of the present invention.

DETAILED DESCRIPTION OF THE PREFERRED EMBODIMENT

The present invention preferably includes a method of and apparatus for entering the burst refresh mode after the memory device is finished with its precharge cycle. There are many ways in which this may be done, and the present invention is not limited to the exemplary methods described infra.

A first way to enter the burst refresh mode is to have circuitry responsive to a change in an input pin voltage. For example, if the user or system were to raise the voltage of a given input pin to above the power supply voltage VCC, to 1.5 VCC, illustratively, the circuitry would construe this as an instruction and initiate a burst refresh mode once the last precharge cycle is completed.

Another way is to use an extra pin of the memory package to provide a signal to the circuitry that will place the memory device in a burst refresh mode. For instance, the circuitry could receive the pin signal and cause the memory device to enter burst refresh mode once the last precharge cycle is completed.

A further way to initiate a burst refresh mode is to send a prescribed sequence of signals through already established package pins. For instance, active write and output enable signals may be provided before a column address strobe before row address strobe ("CBR") signal. Another approach would be to provide an active address bit before a write enable signal. The write enable signal would in turn be provided before a CBR signal. The selection of signalling conditions can be varied within the scope of the present invention.

BLOCK DIAGRAM

Figure 2:
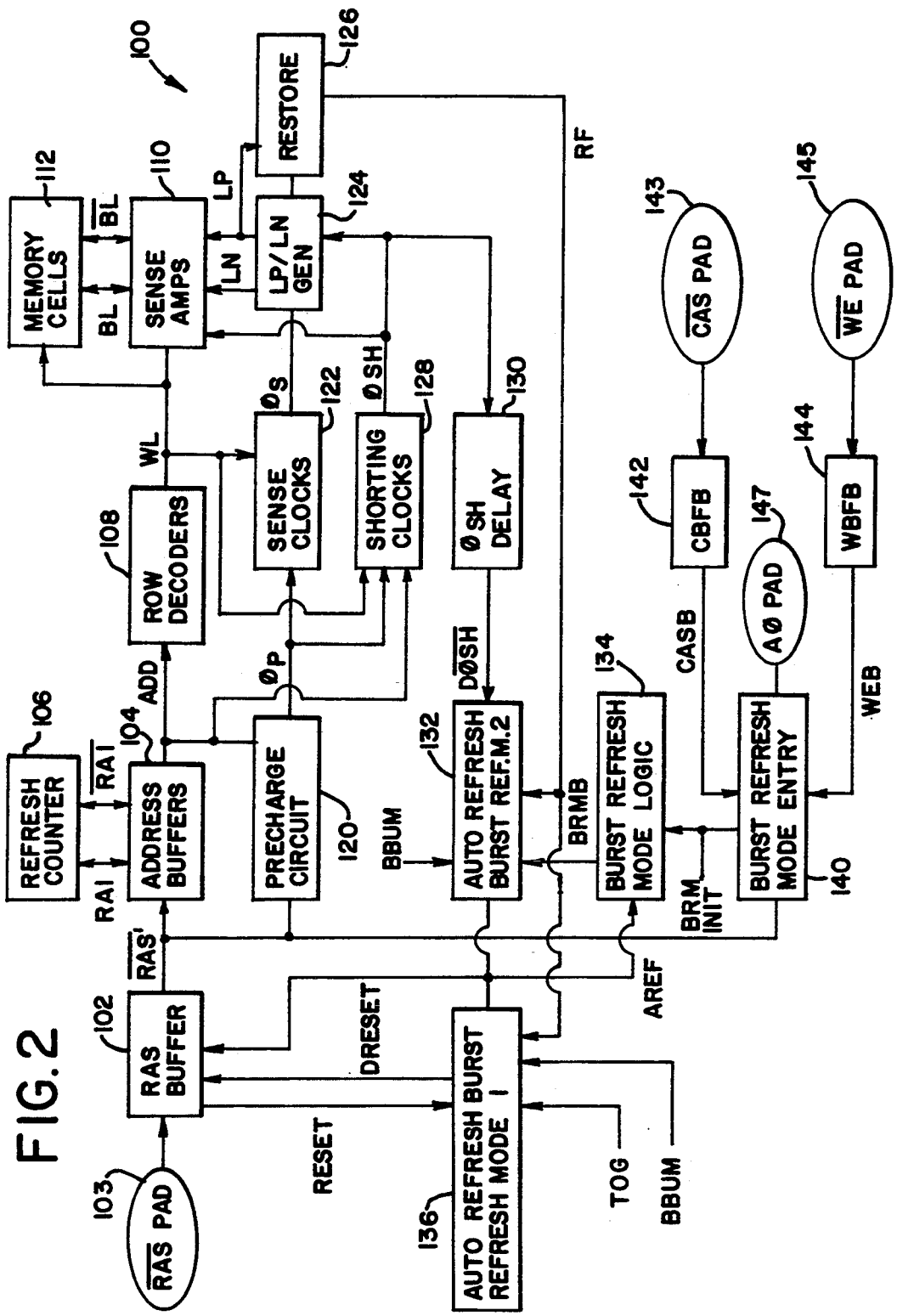
FIG. 2 is a block diagram of a preferred embodiment of the present invention.

FIG. 2 shows a simplified block diagram of relevant portions of a DRAM 100 according to a preferred embodiment of the present invention. FIG. 2 may be read in conjunction with timing charts of FIG. 7 described infra. Starting at the top left, a RAS buffer 102 receives an input from a RAS pad 103. Buffer 102 develops an internal $\overline{RAS}'$ signal, the state of which is a function of at least three things. One is the polarity of the input pad 103. Another factor is whether the system is in self refresh mode (so that the RAS buffer 102 would be controlled with block 136, described infra), or whether the system is in burst refresh mode (so that it is controlled by a block 132 described infra through auto refresh signals).

Buffer circuit 102 provides signal $\overline{RAS}'$ to a set of address buffers 104. Associated with address buffers 104 is refresh counter circuitry 106. Refresh counter 106 provides address bits of real addresses that will be refreshed. It transfers those addresses to the address buffers. Signals RAI and its complement $\overline{RAI}$ are shown on FIG. 2. "RAI" denotes Refresh Address I(th). In a typical 4 meg DRAM, I would index from 0 to 9 to produce ten real addresses. The two signals RAI and $\overline{RAI}$ are duplicated for each of the addresses. In a 4 meg DRAM, there would be ten such pairs of addresses and refresh counter combinations, which would be indexed 0 through 9. At the trailing edge, for example, of a signal to the address buffers 104, all ten of the refresh counters (illustratively) in a 4 meg DRAM, provide row addresses of the next row that is required to be refreshed. This occurs for rows 1 through $2^{10}$ (1024 rows). Preferably no individual bits are addressed here, just rows.

An output of address buffer circuit 104 is a set of internal addresses ADD applied to row decoders 108. The row decoders decode the row from the address information and activate illustratively a single word line by providing an output signal WL to sense amplifier circuitry 110. There are of course numerous sense amplifiers 110 in a large integrated circuit memory, and each such sense amplifier generally is coupled either directly or selectively to memory cells illustrated generally by reference numeral 112. A representative complementary bit line pair BL, $\overline{BL}$ is shown communicating with sense amplifiers 110.

It should be noted that the present invention can be used more fully by incorporating my invention (UM-111) for a DRAM VARIABLE ROW SELECT described in my U.S. Ser. No. 08/013,333 filed on Feb. 4, 1993, now U.S. Pat. No. 5,331,601. This allows the row decoders to access two (or more) rows simultaneously. While the same sense amplifier does not read two different rows at the same time, the architecture of the device can access different arrays at one time.

The $\overline{RAS}'$ signal from circuit 102 is applied also as an input to a precharge circuit 120. Another input to precharge circuit 120 is the address signal ADD from address buffer circuit 104, which tells circuit 120 that it can exit or terminate precharge for that partition or block of the RAM. Circuit 120 then activates the precharge clock signal $\phi_P$ to unshort the array in the sense amps and to get ready to start sensing.

Precharge clock signal $\phi_P$ from circuit 120 is shown in FIG. 2 as an input to sense clock circuitry 122. The word line signal WL is also inputted to circuit 122, which provides a sensing signal $\phi_S$ that is applied as an input to latch P and latch N generator circuits 124. Reference may be had to previously-filed U.S. Ser. No. 07/969,418 filed Oct. 30, 1992 in the name of Kim Hardee for a SENSE AMPLIFIER CLOCK DRIVER (UM-116), now U.S. Pat. No. 5,334,890 and to Ser. No. 07/976,312 filed Nov. 12, 1992, also by him, for a SENSE AMPLIFIER WITH LOCAL WRITE DRIVERS (UM-109). The outputs LN (latch n) and LP (latch p) of generator 124 are applied to the sense amplifiers 110, ideally as the power supply thereto. That is, Latch P can be provided to the source-drain path of p-channel FETs in a CMOS sense amplifier and Latch N would correspondingly be provided to the n-channel FETs thereof. Latch P and latch N are activated or turned on through block 124, thereby allowing the sense amplifier(s) 110 to sense and refresh the memory cell(s) 112.

Preferably, the signal Latch P is applied to restore circuitry 126 which provides a Restore Finished signal RF. That signal is used to automatically time the end of that restore operation. This circuit preferably works in such a way that when Latch P has gone to a high enough level, then restore circuit block 126 senses that it can fire the RF clock (restore finish clock) and send that information to burst refresh mode logic described infra. Circuit 126 determines that the restore is finished because Latch P is a clock that latches the sense amps, and when the sense amps are latched, then that level is written back into the cells. If that level (of Latch P) is high enough, then one can assume that the restore is finished (for that row).

Figure 3:
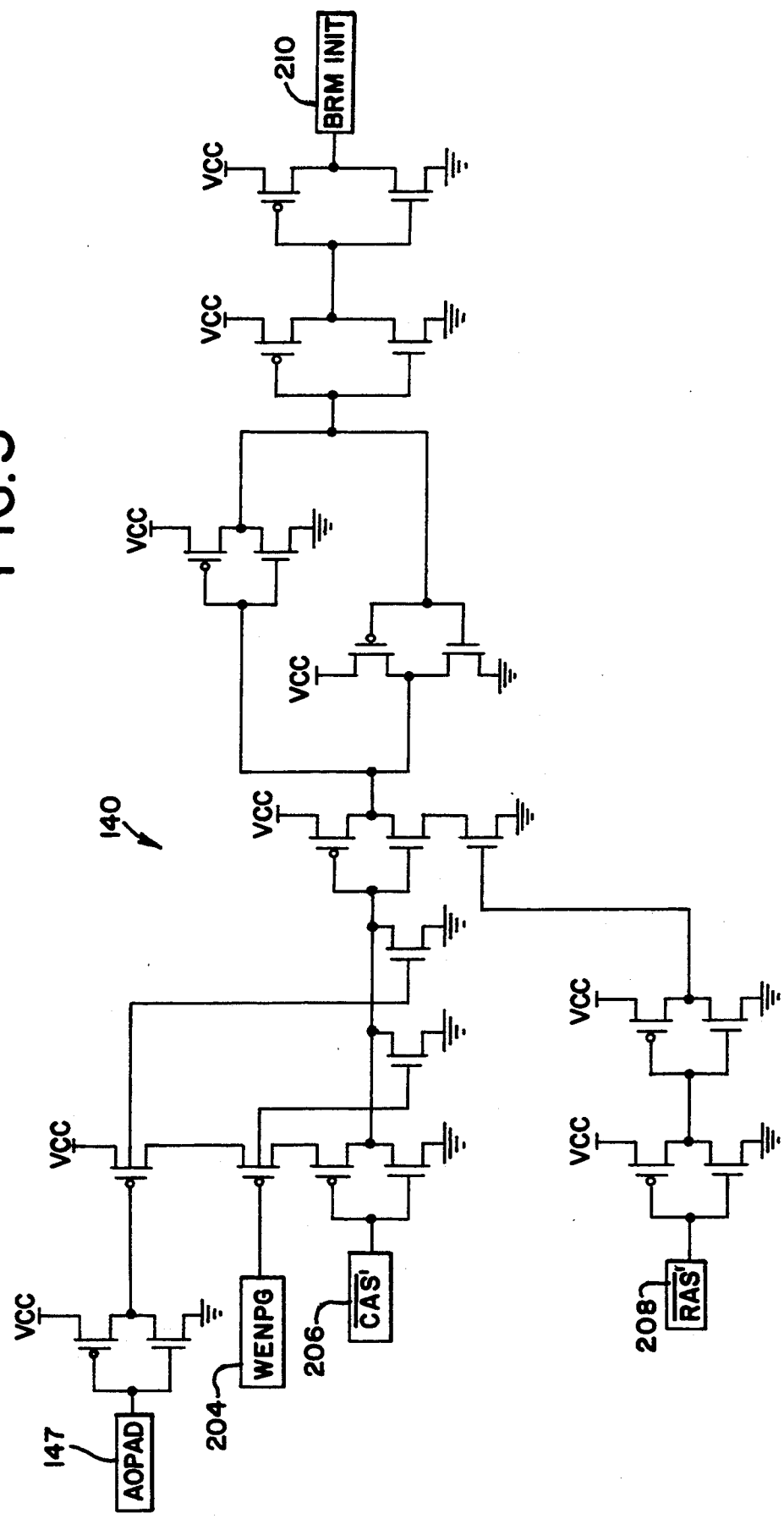
FIG. 3 is a schematic diagram of the preferred embodiment of block 140 (burst refresh mode entry circuit) of FIG. 2.

The restore finish signal RF is applied to circuit blocks 132 and 136 in FIG. 3 to tell the system to bring $\overline{RAS}'$ high in the precharge.

Latch P/Latch N generator circuitry 124 mentioned above receives a signal from shorting clock circuitry 128. The inputs to circuit 128 include the address signal ADD from address buffers 104, the precharge timing signal $\phi_P$ from precharge circuit 120, and the word line signal WL from row decoders 108. Shorting clocks circuit 128 contains the required logic and drivers to turn off "shorting" clock signal $\phi_{SH}$ if the $\phi_P$ clock goes to its inactive state and the proper address of the particular memory block is valid. Circuit 128 also controls the turning on of $\phi_{SH}$ by sensing the level of the WL input. "Shorting" clock signal $\phi_{SH}$ is applied to the generator circuit 124, to sense amplifiers 110, and to a delay circuit 130.

Delay circuit 130 produces a delayed shorting signal $D\phi_{SH}$ that is applied as an input to a circuit 132 which is one of two Auto Refresh Burst Refresh Mode ("ABRM") circuits shown on FIG. 2. The other ABRM circuit is circuit 136. Delay circuit 130 tracks the equilibration of the bit lines and latch clocks. It is noted that at hot operating temperatures or high operating voltages where shorting takes longer, the delay in circuit will also be longer. Therefore, the delay affords adequate time for the precharging of LN and LP lines and the bit line pair. Circuit 132 receives several further inputs including: a signal from burst refresh mode logic 134, the restore finished signal RF from restore circuitry 126, and a battery back-up mode signal BBUM. Circuit 132 provides an auto refresh signal AREF (sometimes referred to as AUTO REF) to circuits 102 and 134. A burst refresh mode bar signal BRMB from logic circuit 134 enables circuit 132 to become active.

Figure 5A:
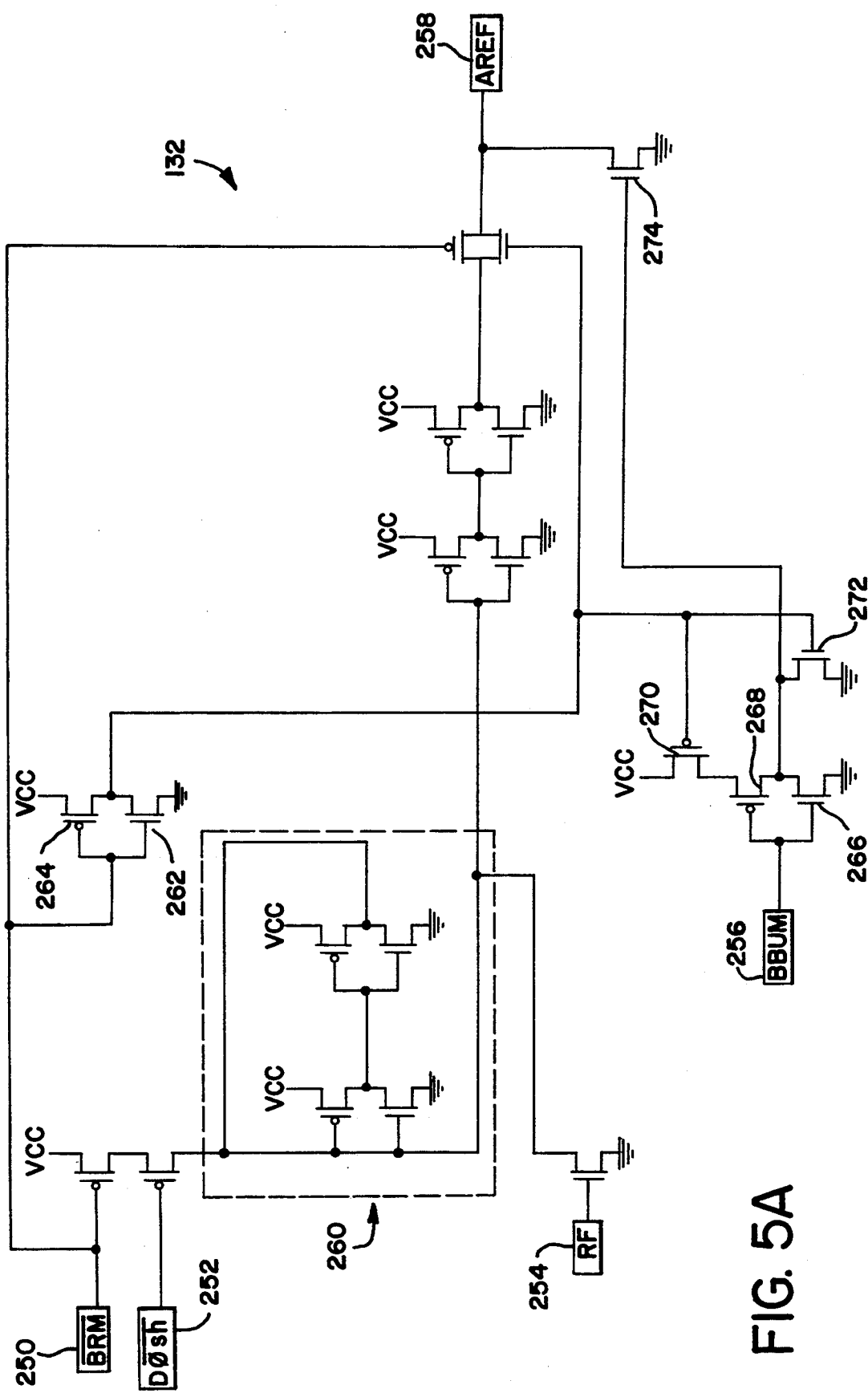
FIGS. 5A and 5B are schematic diagrams of the preferred embodiments of blocks 132 and 136 (the auto refresh burst refresh mode circuits) of FIG. 2.
Figure 5B:
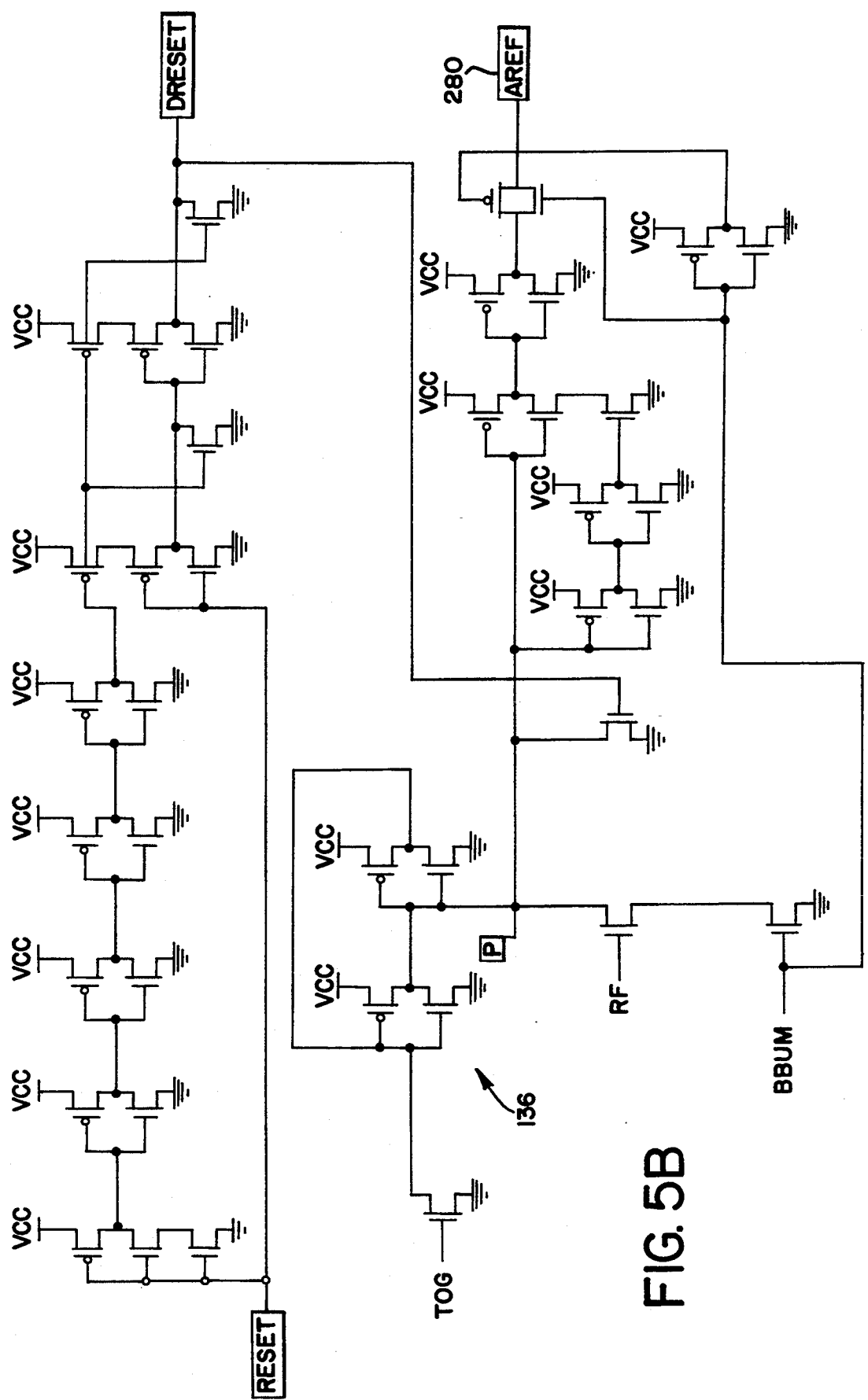

Circuit 136 receives a RESET signal from RAS buffer 102, a toggle signal TOG, the battery back-up signal BBUM, and the restore finished RF from restore circuit 126, as well as generating the auto refresh signal AREF similar to circuit 132. The BBUM signal will enable circuit 136 to drive AREF and disable circuit 132 from driving AREF. Thus it will be understood that in the illustrated embodiment, both circuits 132 and 136 are capable (separately) of generating auto refresh signal AREF, given the appropriate conditions. Such a signal can be provided in the battery back-up mode (BBU mode) or in burst refresh mode (BRM). As shown in FIGS. 5A and 5B, described infra, it is preferred that only one of the two circuits 132 and 136 should be able to generate AREF at any given time.

Shown at the bottom of FIG. 2 is a burst refresh mode entry circuit 140 receiving a signal CASB from a "CAS buffer bottom" circuit 142 and a signal WEB from a "write buffer bottom" circuit 144. Here, "bottom" refers to the physical bottom of the chip, which is not particularly important for the present invention. Circuit 140 further receives an address signal A0 from an A0 address pad 147. Circuit 142 receives an input from a $\overline{CAS}$ pad 143. Circuit 144 receives an input from a write enable $\overline{WE}$ pad 145. Block 142 produces signal CASB, and block 144 produces signal WEB. These are two of four different clocks applied as inputs into the burst refresh mode entry block 140. Buffers 142 and 144 basically convert a TTL level to a CMOS level for internal use.

Circuit 140 is used to detect the conditions for entry into the burst refresh mode. While various conditions could be used to signal entry into such a mode of operation, as noted supra, this mode in the preferred embodiment is initiated when the signals at the CAS 143 pad and write enable pad 145 are both low and address bit A0 at pad 147 is high before the $\overline{RAS}$ pad 103 (voltage) falls low. If that occurs, then burst refresh mode entry circuit 140 brings its output signal BRM INIT to the valid (active) state and the system enters burst refresh mode. This now-active BRM INIT signal is applied to burst refresh mode logic 134.

Circuit 134 includes counters to determine how many burst refresh mode cycles occur internally on the chip. By counting the correct number of cycles (rows), the system can determine when the entire memory has been refreshed and can exit burst refresh mode at that time, thereby to await further instructions, or in an alternate embodiment could begin another sequence of refreshing. Circuit 134 also provides signal BRMB to control circuit 132.

Circuit 132 is one of the two circuits that produces the actual control signal AREF that is applied to RAS buffer 102. Signal AREF controls the timing for $\overline{RAS}'$ to go automatically into active cycles and automatically go into precharge cycles as required. (In this circuit, when $\overline{RAS}'$ is high, the system is in precharge or standby, and when $\overline{RAS}'$ is low, the system is in the active state.) Circuit 132 has knowledge of whether the system has entered burst refresh mode, as determined by blocks 140 and 134. Circuit 132 also determines whether it needs to change the state of the internal $\overline{RAS}$ signal, i.e. whether the system needs to go from a precharge cycle to an active cycle or vice versa. Such determination involves using the restore finish signal RF and the output $D\phi_{SH}$ of circuit 130. It will be recalled that when the restore finish signal RF goes high, this causes or allows block 132 to send a signal to the RAS buffer 102 for the internal RAS signal to go high because one row (or more) has been refreshed and that one active cycle is over.

Now the system precharges for the next row selection. Signal $\overline{RAS}'$ will go high and the system will go through similar clock logic and wrap back around such that signal $D\phi_{SH}$ will then tell the system that the precharge cycle is finished and that another active cycle now needs to be started. In this way, the system self-times the precharge cycle.

Block 136 is an auto refresh block that already exists on common DRAMs today to control what is called "battery back-up mode." It is adapted for use in the preferred embodiment of this invention, but the invention can be practiced without this particular circuit. This circuit is shown receiving a clock signal TOG (a toggle bit) and a battery back-up mode signal BBUM which come from battery back-up mode logic. Block 136 will be disabled when using the present invention, but in the preferred embodiment, it appeared that the system could conveniently use the same auto refresh clock signal as would be generated from circuit 136.

Hence, the key new circuit blocks shown in this FIG. 2 are the burst refresh mode entry block 140, burst refresh mode logic block 134, the timing signal delay block 130, and the auto refresh burst refresh block 132.

CIRCUIT DIAGRAMS

FIG. 3 shows the circuitry for the burst refresh mode entry circuit 140. The inputs are on the left: the A0 pad 147, a write enable input 204 (this one is WENPG, which stands for "write enable, no power gating.") The next input 206 is $\overline{CAS}'$ middle. $\overline{RAS}'$ is the fourth input 208. The output 210 is a burst refresh mode initialize signal BRM INIT. Thus, circuit 140 accepts the four inputs and detects whether or not this write CAS A0 before RAS clock sequence has occurred so it knows whether or not it should send a valid signal out for burst refresh mode BRM INIT. The A0 pad 147 is the lowest level address bit coming from the user, which is a pin on the package. Hence, in the preferred embodiment, circuit 140 is mainly a detector that is arranged to detect the right combination of four particular input signals, as shown on the left side of FIG. 3.

Figure 4:
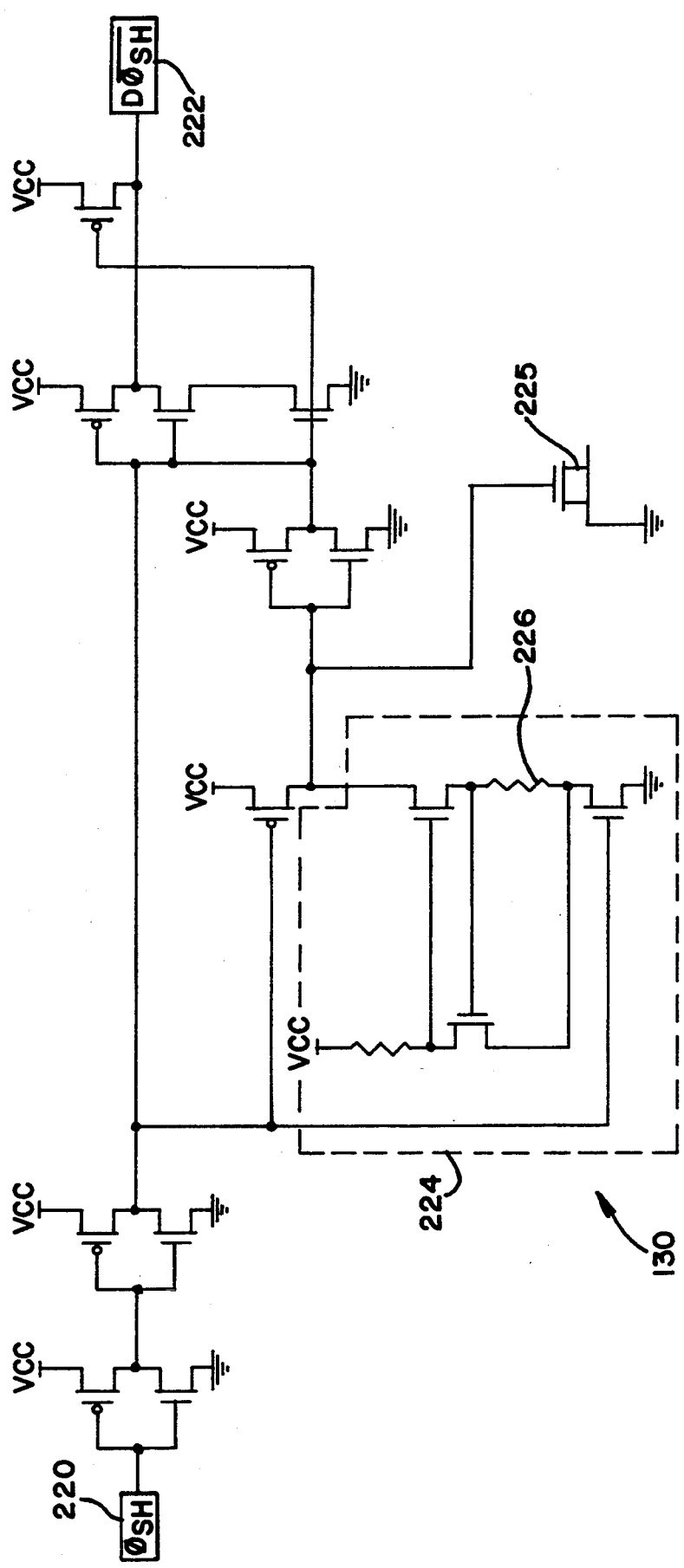
FIG. 4 is a schematic diagram of the preferred embodiment of block 130 ($\phi_{SH}$ delay circuit) of FIG. 2.

FIG. 4 shows circuit 130 which is the $\phi_{SH}$ delay block. This receives the shorting clock $\phi_{SH}$ at input node 220 and generates a delayed signal D$\phi_{SH}$ at output node 222. In the preferred embodiment, this is done by taking an input and delaying it on the rising edge of $\phi_{SH}$ to generate a delay such that the falling edge of D$\phi_{SH}$ will occur later, illustratively about 10 nanoseconds. While a delay can be generated by passing a signal through a succession of inverters, in the preferred embodiment, a constant current source 224 is combined with an RC delay circuit. FIG. 4 shows an MOS capacitor 225 and the resistor 226 within current source 224.

Part of circuit 130 functions to detect that the bit lines and the latch lines have started to be shorted together and to allow enough time for that shorting process to reach completion. Hence it is preferred that a circuit such as this be used and that it will track changing conditions. When VCC is very high, the equilibration of the bit lines and latch clocks actually takes longer since the voltage difference before $\phi_{SH}$ goes high is larger than when Vcc is low. This equilibration also takes longer when the circuit operating temperature rises. Circuit 130 provides a longer delay with high VCC and/or with increased operating temperature. Thus, in the preferred embodiment, circuitry is provided to detect the state of $\phi_{SH}$ and then measure out a delay.

FIG. 5A shows the new auto refresh generator block 132. When in burst refresh mode, this block 132 generates an auto refresh signal AREF that will control the times for $\overline{RAS}'$ to go high and low. Circuit 132 as shown in FIG. 5A receives its input signals $\overline{BRM}$ at a node 250, D at a node 252, RF at a node 254, and BBUM at a node 256. The output of this circuit is the signal AREF at a node 258. Circuit 132 contains a latch circuit 260.

It may be noted that if the system enters battery back-up mode, then the auto-refresh circuitry of circuit block 132 is disconnected and isolated from the circuit. Battery back-up mode is a mode of refreshing the DRAM and it differs from the present invention in at least the respect that battery back-up mode refreshes the memory with minimum power rather than maximum speed.

If the system is in neither burst refresh mode nor battery back-up mode, then circuit 132 pulls AREF low. The battery back-up mode signal BBUM at node 256 together with $\overline{BRM}$ at node 250 and transistors 262-274 disables AREF at output node 258 when not in battery back up mode or burst refresh mode. If the system is in burst refresh mode, then the input voltage at node 250 will be low. This will enable the signal at input node 252 to be seen as an input to this circuit. When that clock goes low, then it sets a latch 260 and drives the AREF signal high. This will cause the $\overline{RAS}'$ to enter an active cycle. When the RF input at node 254 fires, then it sets auto-refresh signal AREF low by setting latch 260. In this way, self-timing occurs.

If the system is in burst refresh mode, battery back-up signal BBUM will be low. That signal is inverted by transistors 266 and 268 which would turn on transistor 274 to lock AREF low. However, transistors 262 and 264 invert the active low input from node 250 thereby to turn on transistor 272. That grounds the gate electrode of transistor 274 and permits AREF to become active.

FIG. 5B shows a preferred embodiment of circuit block 136. As shown in both FIG. 2 and FIG. 5B, this circuit receives the RESET signal from RAS buffer 102, the restore finished signal RF from circuit 126, the toggle input TOG, and the battery back up mode signal BBUM. Circuit 136 can generate an auto-refresh signal AREF at an output node 280 and a DRESET signal that is applied to RAS buffer 102. When the DRAM is in the battery back-up mode, AREF at output node 280 becomes an active signal, and toggles in accordance with inputs TOG and RF. The input signal RESET and the output signal DRESET (delayed reset) are used in exiting from battery back-up mode. It should be noted that circuit 136 does not receive the BRMB signal from circuit block 134 (FIGS. 2, 6A, and 6B) and therefore does not produce any AREF output signal when the DRAM enters burst refresh mode. Rather, the AREF signal is produced by circuit 132 shown in FIG. 5A, at output node 258 thereof, as already described.

Figure 6A:
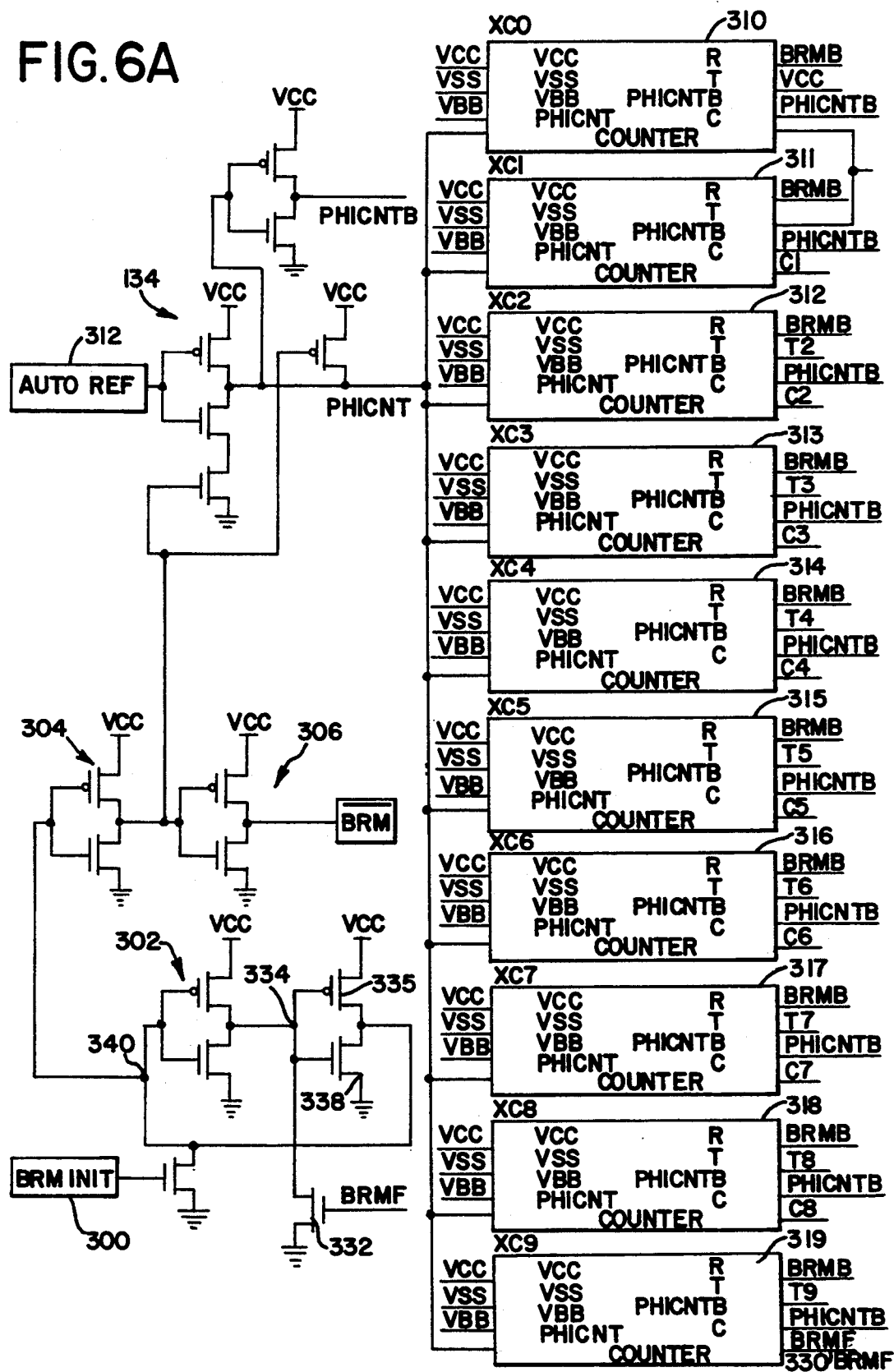

FIGS. 6A and 6B show the burst refresh mode logic 134, which provides the signal $\overline{BRM}$ to input node 250 in FIG. 5A. The burst refresh mode initialize signal BRM INIT from output node 210 in FIG. 3 is applied to input node 300 in FIG. 6. When that input signal is active, it sets a latch 302. Via inverters 304 and 306, this will also drive the burst refresh mode bar signal $\overline{BRM}$ low so that will tell circuit block 132 (FIG. 2) that the system is actively in burst refresh mode. The signal will also be used to control a bank of counters 310-319. Counters 310-319 are marked as blocks XC0 through XC9 which are symbols representing counter bits. These are used to count how many burst refresh mode cycles have occurred, so that the whole array can be refreshed.

FIG. 6B shows eight circuit blocks 320-327 which represent AND gates used to generate toggle inputs T to the counters 310-319. Counter bit C0 is the least significant bit so the T input to counter 310 is shorted to VCC. This will cause c0 to change states with each $\phi$CNT cycle. C1 is the next bit and will change states on $\phi$CNT cycles when c0 is high, so c0 is used for its T (toggle) input. AND gate 320 causes t2 to go high when C0 and C1 are both high. This causes C2 to be the next order bit. Gate 322 generates t3 which is valid when C2, C1 and C0 are all high (since t2 is C0 and C1). This logic is continued up to t9 which is generated by AND gate 327, the logical AND of all lower order c bits, c0 to c8.

Signal BRM INIT will start the counters 310-319, which will count how many rows are selected by using AUTO REF (see input node 312) as the input so every time that AUTO REF goes high, it will toggle another bit in the counters. Thus, the system does not have a clock driving the counters. Rather it counts the number of auto refresh cycles that have occurred, based on the number of times RF and D$\phi_{SH}$ change state.

FIG. 6A also shows that a burst refresh mode finish signal BRMF is generated as an output 330 from the last counter 319. That signal is used to gate a transistor 332. When the last carry bit goes high, then it will change the state of latch 302 and turn it off. It can be seen that when BRMF goes high, transistor 332 turns on to pull a node 334 low. This is inverted by transistors 336 and 338 to drive a node 340 high. That high signal is twice inverted by inverters 304 and 306, thus driving $\overline{BRM}$ high, i.e. to the inactive state.

OPERATION

Figure 1:
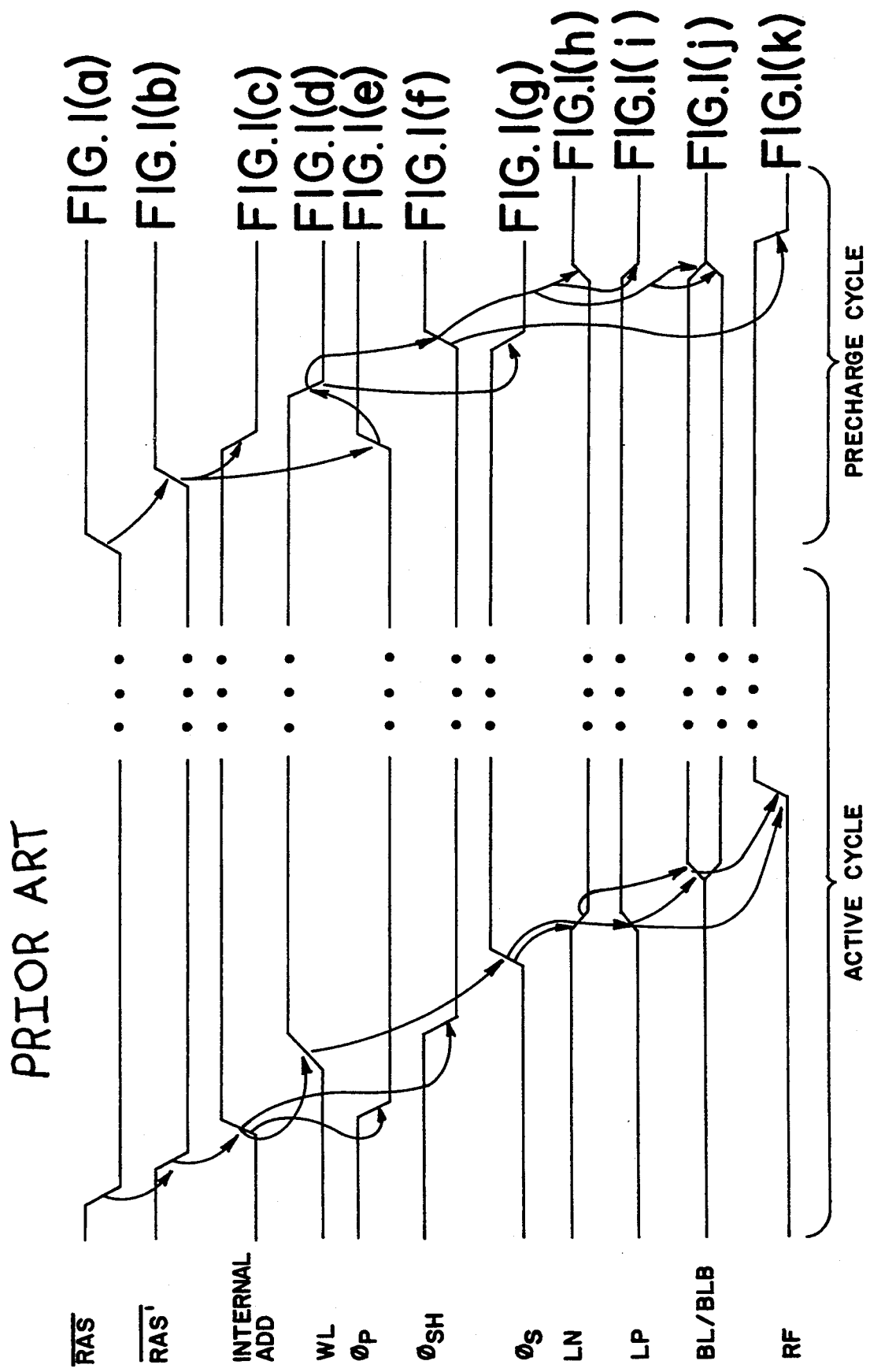
FIGS. 1(*a*) to 1(*k*) is a set of timing diagrams for conventional refresh and precharge cycles of a DRAM.

FIGS. 7(a)-(s) illustrate a timing sequence of a refresh and a precharge cycle utilizing the present invention. Signals in FIGS. 1 and 7 having the same function are designated the same. FIGS. 7(a), (b), (c) and (d) show four externally applied signals $\overline{WE}$, $\overline{CAS}$, A0 and $\overline{RAS}$ respectively. When the timing of these four signals is as shown, burst refresh mode initiate signal BRM INIT (FIG. 7e) goes active. The first rising edge of AREF keeps the internal $\overline{RAS}'$ low and isolates the RAS pad from internal $\overline{RAS}'$. This allows RAS pad to become a "don't care." FIG. 7(d) shows that external signal $\overline{RAS}$ is preferably in a "don't care" state once burst refresh mode initiate signal BRM INIT is activated.

Burst refresh mode signal BRM INIT triggers signal $\overline{BRM}$. When $\overline{BRM}$ goes low, auto-refresh signal AREF goes high as shown in FIGS. 7(f) and (g). Auto-refresh signal AREF is substituted for the external signal $\overline{RAS}$ (FIG. 1(d)). This is done to remove the external control of internal signal $\overline{RAS}$. Auto-refresh signal AREF triggers internal signal $\overline{RAS}'$ to become active, as shown in FIGS. 7(g) and (h). Internal signal $\overline{RAS}'$ triggers internal address signal ADD to become active which triggers precharge clock signal $\phi_P$ to become inactive, as shown in FIGS. 7(h), (i) and (k).

Internal address signal ADD triggers word line signal WL to become active, as shown in FIGS. 7(i) and (j). Word line signal WL triggers sense clock signal $\phi_S$ to become active, as shown in FIGS. 7(j) and (i). Internal address signal ADD triggers shorting clock signal $\phi_{SH}$ to become inactive, as shown in FIGS. 7(i) and (l). Shorting clock signal $\phi_{SH}$ triggers delayed shorting signal D$\phi_{SH}$ to become inactive, as shown in FIGS. 7(l) and (r).

Sense clock signal $\phi_S$ triggers latch driver signals LN and LP to the active state, as shown in FIGS. 7(n)-(o). Both latch signals LN and LP trigger bit line and bit line bar signal BL/$\overline{BL}$ to be active. The LP signal triggers restore finish signal RF to become active, as shown in FIGS. 7(o) and (q). Restore finish signal RF triggers auto-refresh signal AREF to the inactive state, as shown in FIGS. 7(g) and (q).

As illustrated in FIGS. 7(g) and (h), inactive auto-refresh signal AREF triggers internal signal $\overline{RAS}'$ to become inactive. Inactive internal signal $\overline{RAS}'$ triggers internal address signal ADD to become inactive and precharge clock signal $\phi_P$ to become active, as shown in FIGS. 7(h), (i) and (k). As illustrated in FIGS. 7(j) and (k), active precharge clock signal $\phi_P$ triggers the WL inactive. The WL then triggers the sense clock signal $\phi_S$ inactive as shown in FIGS. 7(j) and (m). Clock signal $\phi_S$ triggers the restore finished signal RF inactive as shown in FIGS. 7(l) and (q).

Inactive word line signal WL also triggers shorting clock signal $\phi_{SH}$ active as shown in FIGS. 7(j) and (l). Active shorting clock signal $\phi_{SH}$ triggers latch signals LN and LP and bit line and bit line bar signal BE/$\overline{LB}$ to become inactive, and delayed shorting dock signal D$\phi_{SH}$ to become active, as shown in FIGS. 7(l), (n), (o), (p) and (r). Active delayed shorting signal D$\phi_{SH}$ triggers auto-refresh signal AREF active as shown in FIGS. 7(g) and (r).

The foregoing description explains a burst-refresh mode for a single row. Briefly, when auto-refresh signal AREF changes to an active state, the row address is supplied, preferably by the internal counters 310-319 of FIG. 6A. The row is accessed and the data values on the bit lines are sensed. When the refresh finished signal RF changes to an inactive state, the memory array has left the access mode and is now in the restore mode. When the delayed shorting signal D$\phi_{SH}$ transitions preferably to an active state, the row is through with precharge. Further, the delayed shorting signal D$\phi_{SH}$ self-times the next refresh of another row by triggering the auto-refresh signal AREF, specifically, the trailing edge of D$\phi_{SH}$ triggers the next rising edge of AREF, as seen in FIGS. 7(r) and (g). The first AREF signal was caused by the $\overline{BRM}$ leading edge.

The burst refresh mode cycles are faster than regular access cycles since the address used to select which rows are refreshed comes from refresh counters instead of externally supplied signals. Because of the location of the refresh counters and required logic for external signals, this can save several nanoseconds in each cycle.

The self-timed feature of this invention also reduces the time required to complete refresh while in burst refresh mode. This allows the circuit to go as fast as it can while eliminating the need for clock margins required when externally supplying the clocks over temperature and voltage operating ranges. These two items can save roughly 15% off a conventional DRAM refresh cycle.

To further increase speed of refreshing during the burst refresh mode of the present invention, a variable select row address circuit may be implemented. An example of such a variable DRAM row select circuit is disclosed in my co-pending U.S. application Ser. No. 08/013,333 filed Feb. 4, 1993 entitled DRAM VARIABLE ROW SELECT (attorney docket UM-111). The use of such a circuit as disclosed in the above-identified application effectively increases the speed of the refresh by increasing the number of addressed rows. Briefly, the circuit is configured so that it can block an address bit and provide an active address signal to an address decoder in place of the blocked address bit. This will cause more rows to be addressed than if that address bit were inactive. Such configuration, as disclosed, would double (or more) the minimum number of rows addressed for each address bit blocked. Hence, the number of rows can be effectively increased for refreshing and therefore the amount of time to refresh would be diminished by, for example, a factor of two.

To refresh 4 million bits using this arrangement and technique would require on the order of 100 nanoseconds per row (selecting a row, restoring its data, turning off the row, and precharging the bit lines and latch circuitry) times 512 rows, i.e. 50 microseconds. The typical format DRAM architecture is configured with 1,024 rows. The foregoing calculation assumes that the system would select two at a time, 512 selections occur. This results in a time savings of about 50%. The total time required to refresh a dynamic RAM with this invention can then be 85% of the 50% when adding in all the speed savings in the previous 3 paragraphs, or about 57% faster than conventional refresh cycles. Further, the present invention simplifies the user's circuitry or its operation because a memory controller used with a memory having the present invention will not need to provide the memory with 1,024 CAS before RAS cycles or 1,024 RAS only refresh cycles. Instead, the memory controller can simply initialize the burst refresh mode and wait for the invention to refresh the memory. The associated memory controller does not have to provide inputs to the memory.

It should be appreciated that the foregoing description is directed to a preferred embodiment of the present invention, and that numerous modifications or alterations can be made without departing from the spirit or scope of the present invention.

What is claimed as the invention is:

1. A method for refreshing a memory circuit that includes a plurality of rows of memory cells in an array that need to be refreshed from time to time, and that operates with a sequence of an active cycle and a precharge cycle, the method comprising the steps of:
   entering a burst refresh mode;
   providing an address from an internal counter for refreshing a row of the memory cells;
   self-timing an active cycle wherein the row specified by the internal counter address is refreshed;
   self-timing the activation of the precharge cycle and the start of the next active cycle; and
   sequentially repeating said step of providing an address and said steps of self-timing so that said array is refreshed during said burst refresh mode.

2. The method of claim 1 wherein the step of providing addresses from the internal counter further includes employing a variable row select function to select more rows for refreshing than in a normal mode of operation of the memory circuit so that each active cycle refreshes more rows than are normally refreshed in normal mode.

3. The method of claim 1 wherein said step of entering burst refresh mode includes detecting a set of prescribed conditions on one or more inputs to said memory circuit.

4. The method of claim 3 wherein said detecting step includes detecting said prescribed conditions among an address bit, a column address signal and a write enable signal.

5. The method of claim 1 wherein said step of self-timing the active cycle includes:
   detecting the condition of an electrical signal used during a sensing operation associated with said refreshing, and
   determining whether said electrical signal has reached a predetermined condition.

6. The method of claim 5 wherein said memory circuit uses a latch signal to latch sense amplifiers within the memory circuit, and wherein said condition is a voltage level of said latch signal.

7. The method of claim 6 wherein said latch signal is a latch signal for activating p-channel transistors in sense amplifiers of the memory circuit.

8. The method of claim 1 wherein said precharge cycle is associated with a clock signal, and wherein said step of self-timing the precharge cycle includes interposing a delay based on said clock signal.

9. The method of claim 8 wherein said clock signal includes a shorting clock signal, and wherein said step of self-timing the precharge cycle includes receiving said shorting clock signal and providing a delayed shorting clock signal based thereon.

10. The method of claim 1 including counting the number of burst refresh mode cycles so that all of said rows of the memory circuit are refreshed.

11. The method of claim 1 further comprising generating a burst refresh mode finished signal when all of the rows have been refreshed.

12. A method of refreshing an integrated circuit memory comprising the steps of:
   detecting conditions for entering a burst refresh mode, and if said conditions are detected, then generating an auto-refresh signal (AREF);
   internally producing an internal address signal (ADD) and refreshing one or more rows based on said internal address signal;
   internally detecting when said refreshing of one or more rows is substantially completed; and
   repeating said steps of internally producing and internally detecting until all of the memory has been refreshed.

13. The method of claim 12 wherein said step of repeating includes indexing a count of rows that have been refreshed and terminating said burst refresh mode when all of the rows have been refreshed.

14. The method of claim 13 wherein said step of indexing includes counting the number of times said auto-refresh signal is generated.

15. A method of refreshing an integrated circuit memory comprising the steps of:
   entering a burst refresh mode;
   during burst refresh mode, deriving addresses locally, on the same integrated circuit, and conducting refresh operations on a succession of rows of memory cells in the integrated circuit using locally-derived addresses;
   during said burst refresh mode, disregarding addresses applied to input pins of the integrated circuit; and
   during said burst refresh mode, self-timing the refresh cycles for the rows being refreshed.

16. The method of claim 15 wherein said self-timing includes self-timing at least a selected one of an active cycle and a precharge cycle for each row being refreshed.

17. The method of claim 16 wherein said self-timing includes self-timing both the active cycle and the precharge cycle for each row being refreshed, including internally detecting when said refreshing of a row is substantially completed.

18. A method for refreshing a memory circuit that includes a plurality of rows of memory cells in an array that need to be refreshed from time to time, and that operates with a sequence of an active cycle and a precharge cycle, the method comprising the steps of:
   entering a burst refresh mode;
   self-timing an active cycle to refresh at least one row of memory cells;
   self-timing the activation of the precharge cycle and the start of the next active cycle; and
   providing addresses from an internal counter for use in said active cycle to refresh at least one row;

wherein said step of self-timing an active cycle includes detecting a voltage level of a latch signal used to latch sense amplifiers within the memory circuit and determining whether said voltage level has reached a predetermined condition.

19. The method of claim 18 further comprising generating a burst refresh mode finished signal when all of the rows have been refreshed.

20. A memory circuit comprising:
- a plurality of memory cells arranged in rows and columns;
- a plurality of sense amplifiers coupled to said columns of memory cells;
- a sense amplifier driver circuit coupled to said plurality of sense amplifiers;
- a control signal circuit (102) coupled to receive an externally-applied control signal(/RAS);
- a refresh counter circuit (106);
- a plurality of address buffers coupled to said control signal circuit and said refresh counter circuit;
- a row decoder circuit coupled to said address buffers and to said rows of memory cells;
- a precharge and clock circuit responsively coupled to said control signal circuit for providing a precharge signal used to precharge the sense amplifiers;
- a detector circuit (126) coupled to said sense amplifier driver circuit to provide a refresh finished (RF) signal indicative that a refresh cycle is substantially completed;
- a burst refresh mode control circuit (134, 140) coupled to receive externally-applied signals and effective for determining whether the memory circuit should enter burst refresh mode; and
- a selectively operable burst refresh mode circuit (132) responsively coupled to said burst refresh mode control circuit,
- the burst refresh mode circuit being coupled to said control signal circuit (102) and coupled to receive said refresh finished signal (RF) from said detector circuit (126),
- said burst refresh mode circuit being effective to cause said memory circuit to generate successive addresses for refreshing rows of memory cells in response to successive ones of said refresh finished signal (RF).

21. The memory circuit of claim 20 wherein said burst refresh mode control circuit includes a burst refresh mode logic circuit (134) providing a counting function to determine when all rows of the memory circuit have been refreshed in the burst refresh mode.

22. The memory circuit of claim 20 further comprising a delay circuit coupled to receive a precharge clock signal produced by said precharge and clock circuit and to provide a delayed timing signal based thereon to said burst refresh mode circuit.

* * * * *